(12) United States Patent
Lin et al.

(10) Patent No.: US 8,401,511 B2
(45) Date of Patent: Mar. 19, 2013

(54) CURRENT-MODE WIRELESS RECEIVER AND RECEPTION METHOD THEREOF

(75) Inventors: Ying-Hsi Lin, Hsinchu (TW); Yi-Shao Chang, Kaohsiung County (TW)

(73) Assignee: Realtek Semiconductor Corp., Hsinchu (TW)

( * ) Notice: Subject to any disclaimer, the term of this patent is extended or adjusted under 35 U.S.C. 154(b) by 111 days.

(21) Appl. No.: 12/942,472

(22) Filed: Nov. 9, 2010

(65) Prior Publication Data
US 2011/0111717 A1  May 12, 2011

(30) Foreign Application Priority Data
Nov. 10, 2009 (TW) ............................. 98138068 A

(51) Int. Cl.
H04B 1/26 (2006.01)
H04B 15/00 (2006.01)
H04B 7/00 (2006.01)
H04B 1/28 (2006.01)

(52) U.S. Cl. ............... 455/313; 455/245.1; 455/293; 455/323; 455/333

(58) Field of Classification Search ............... 455/232.1, 455/234.1, 245.1, 248, 296, 311–326, 333, 455/248.1, 289–293
See application file for complete search history.

(56) References Cited

U.S. PATENT DOCUMENTS

| 6,021,323 | A | * | 2/2000 | Vagher | 455/324 |
| 7,280,815 | B2 | * | 10/2007 | Pellat et al. | 455/326 |
| 7,415,260 | B2 | | 8/2008 | Stockstad et al. | |
| 7,514,981 | B2 | * | 4/2009 | Yang et al. | 327/359 |
| 7,773,969 | B2 | * | 8/2010 | Simon | 455/333 |
| 7,853,233 | B2 | * | 12/2010 | Wu | 455/323 |
| 2003/0087624 | A1 | | 5/2003 | Leenaerts | |
| 2008/0238496 | A1 | | 10/2008 | Huang | |
| 2008/0280584 | A1 | * | 11/2008 | Ko et al. | 455/333 |
| 2009/0170464 | A1 | * | 7/2009 | Jonsson | 455/313 |
| 2009/0191833 | A1 | * | 7/2009 | Kaczman et al. | 455/296 |
| 2009/0258623 | A1 | * | 10/2009 | Connell et al. | 455/234.1 |
| 2010/0035572 | A1 | * | 2/2010 | Zhang et al. | 455/323 |

FOREIGN PATENT DOCUMENTS

| CN | 101326711 | 12/2008 |
| TW | 200937817 | 9/2009 |

OTHER PUBLICATIONS

English Abstract Translation of TW200923717 (Published Sep. 1, 2009).
English Abstract Translation of CN101326711 (Published Dec. 17, 2008).

* cited by examiner

*Primary Examiner* — Simon Nguyen
(74) *Attorney, Agent, or Firm* — McClure, Qualey & Rodack, LLP

(57) ABSTRACT

A current-mode wireless receiver includes a pre-processor to receive a voltage-mode input signal and output a current-mode pre-processed signal corresponding to the voltage-mode input signal, a mixer to perform frequency down-conversion upon the current-mode pre-processed signal to generate a current-mode frequency down-converted signal, and an amplifier to amplify the current-mode frequency down-converted signal to generate a current-mode output signal. A method of wireless reception is also disclosed.

17 Claims, 4 Drawing Sheets

CURRENT-MODE WIRELESS RECEIVER AND RECEPTION METHOD THEREOF

CROSS-REFERENCE TO RELATED APPLICATION

This application claims priority of Taiwanese Application No. 098138068, filed on Nov. 10, 2009.

BACKGROUND OF THE INVENTION

1. Field of the Invention

The invention relates to a wireless receiver, more particularly to a current-mode wireless receiver.

2. Description of the Related Art

Conventional wireless receiver can be classified into two categories, specifically, a voltage-mode wireless receiver and a hybrid wireless receiver having components that transmit voltage-mode signals and other components that transmit current-mode signals.

In the case of the voltage-mode wireless receiver, since a relatively high supply voltage must be provided to avoid clipping of the output signal, the power consumption of the voltage-mode wireless receiving system is high. Moreover, when a high gain is required, a number of transistors connected in series are employed to realize a voltage-mode amplifier, thereby resulting in reduction of linearity of the output signal and generation of low frequency noise.

In the case of the hybrid wireless receiving system, such as those disclosed in U.S. Pat. No. 7,415,260B2, and United States Patent Application Publication Nos. 20030087624A1 and 20080238496A1, non-linear component of the output signal is generated as the current-mode and voltage-mode signals are transmitted among the various components. Further, a relatively high supply voltage is also required for the voltage-mode signal transmission.

However, with the progress of manufacturing techniques and the demand for lower power consumption, the design trend of electronic devices (especially portable electronic devices) is toward a lower supply voltage. The aforementioned receivers are not suitable for operation under a low supply voltage

SUMMARY OF THE INVENTION

Therefore, an object of the present invention is to provide a current-mode wireless receiver capable of alleviating the above drawbacks of the prior art.

Accordingly, the current-mode wireless receiver of this invention comprises a pre-processor, a mixer, and an amplifier. The pre-processor is for receiving a voltage-mode input signal and outputting a current-mode pre-processed signal corresponding to the voltage-mode input signal. The mixer is for performing frequency down-conversion upon the current-mode pre-processed signal to generate a current-mode frequency down-converted signal. The amplifier is for amplifying the current-mode frequency down-converted signal to generate a current-mode output signal.

According to another object of the present invention, a wireless receiver comprises a pre-processor, a mixer, and an amplifier. The pre-processor is for receiving an input signal and outputting a pre-processed signal corresponding to the input signal. The mixer is for performing frequency down-conversion upon the pre-processed signal to generate a frequency down-converted signal. The amplifier is or amplifying the frequency down-converted signal to generate an output signal. The pre-processed signal from the pre-processor, the frequency down-converted signal from the mixer, and the output signal from the amplifier are all current-mode signals.

According to still another object of the present invention, a method of wireless reception comprises:

A) configuring a pre-processor to receive a voltage-mode input signal and output a current-mode pre-processed signal corresponding to the voltage-mode input signal;

B) configuring a mixer to perform frequency down-conversion upon the current-mode pre-processed signal to generate a current-mode frequency down-converted signal; and C) configuring an amplifier to amplify the current-mode frequency down-converted signal to generate a current-mode output signal.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
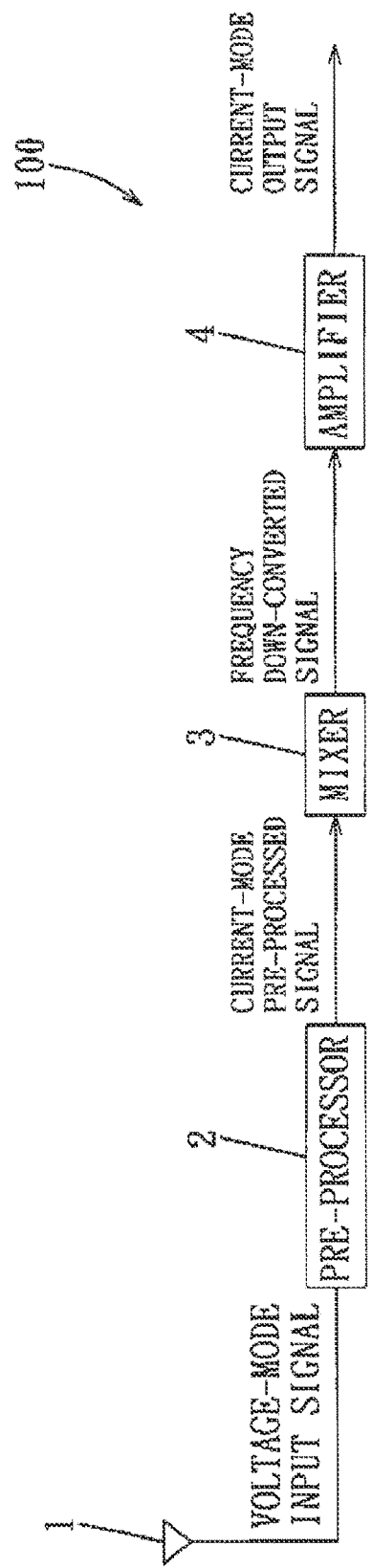
FIG. 1 is a schematic block diagram of a first preferred embodiment of a wireless receiver according to the present invention.

Referring to FIG. 1, the first preferred embodiment of a current-mode wireless receiver 100 according to the present invention comprises an antenna 1, a pre-processor 2, a mixer 3, and an amplifier 4.

The pre-processor 2 is for receiving a voltage-mode input signal from the antenna 1 and outputting a current-mode pre-processed signal corresponding to the voltage-mode input signal. The mixer 3 is for performing frequency down-conversion upon the current-mode pre-processed signal to generate a current-mode frequency down-converted signal. The amplifier 4 is for amplifying the current-mode frequency down-converted signal to generate a current-mode output signal. In other words, amplifier 4 is a current mode amplifier. Preferably, the pre-processed signal is a Radio Frequency (RF) bandwidth signal, and the current-mode frequency down-converted signal is an Intermediate Frequency (IF) bandwidth signal.

Figure 2:
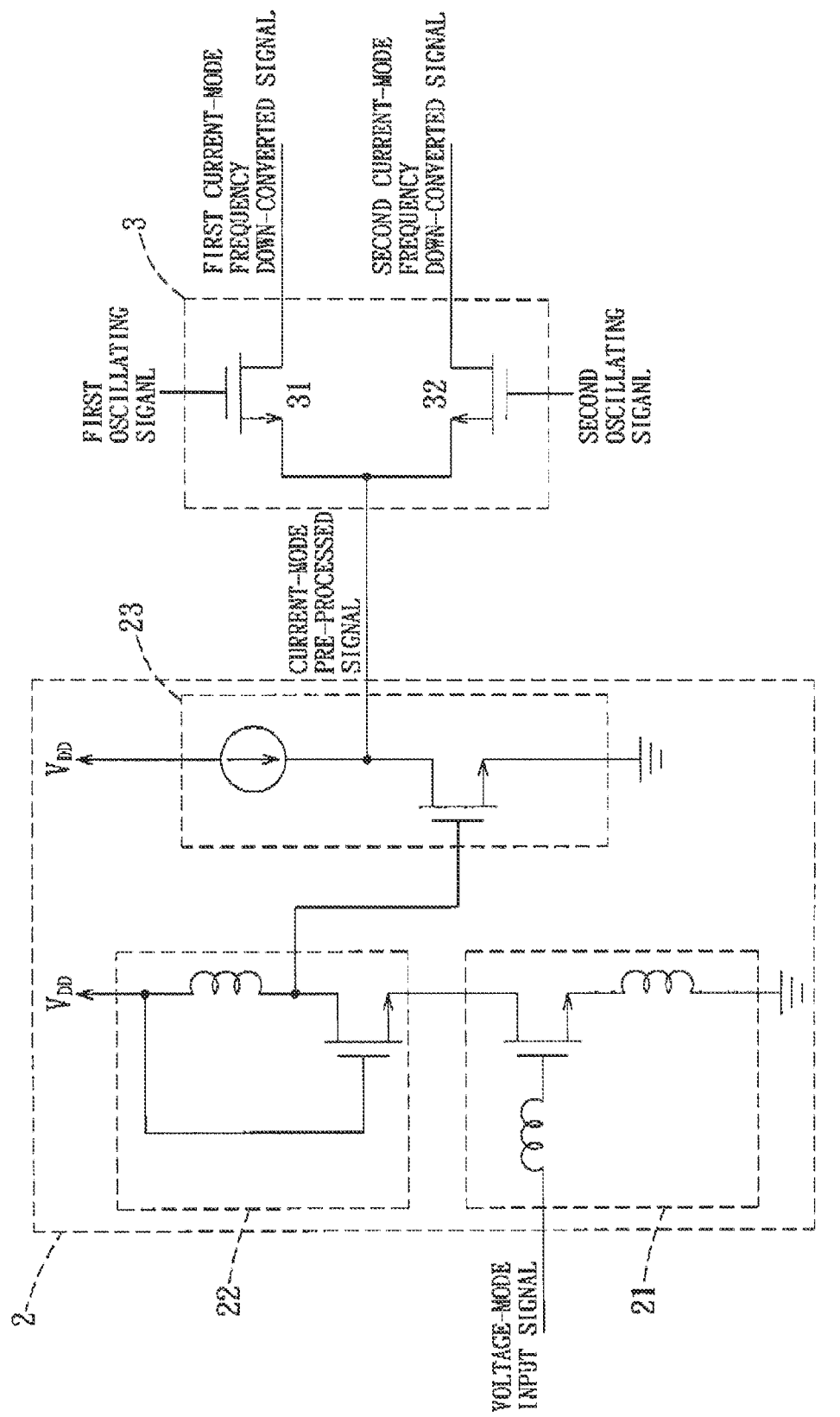
FIG. 2 is a circuit diagram, illustrating a pre-processor and a mixer of the first preferred embodiment.

Referring to FIG. 2, in this preferred embodiment, the pre-processor 2 is a low noise amplifier (LNA). The pre-processor 2 includes an impedance matching circuit 21, a high-frequency amplifier circuit 22, and a transconductor circuit 23.

The impedance matching circuit 21 is for receiving the voltage-mode input signal and for minimizing reflection of the voltage-mode input signal. The high-frequency amplifier circuit 22 is for receiving and amplifying a signal from the impedance matching circuit 21 to output a voltage-mode high-frequency signal. The transconductor circuit 23 is for receiving the voltage-mode high-frequency signal from the high-frequency amplifier circuit 22 and converting the voltage-mode high-frequency signal into the current-mode pre-processed signal.

The mixer 3 includes first and second transistors 31, 32 each having a first end, a second end, and a control end. The first ends of the first and second transistors 31, 32 are electrically connected to each other, and the control ends of the first and second transistors 31, 32 receive first and second oscillating signal respectively. The first transistor 31 is for receiving the current-mode pre-processed signal and the first oscillating signal. The first transistor 31 outputs a first current-mode frequency down-converted signal as the current-mode frequency down-converted signal according to the current-mode pre-processed signal when the first transistor 31 is controlled by the first oscillating signal to conduct, and the second transistor 32 is cut-off by the second oscillating signal.

The second transistor 32 is for receiving the current-mode pre-processed signal and, the second oscillating signal that is complementary to the first oscillating signal. The second transistor 32 outputs a second current-mode frequency down-converted signal as the current-mode frequency down-converted signal according to the current-mode pre-processed signal when the second transistor 32 is controlled by the second oscillating signal to conduct and the first transistor 31 is cut-off by the first oscillating signal.

It should be noted that the mixer 3 is a passive mixer in this preferred embodiment, i.e., the mixer 3 does not receive a supply voltage $V_{DD}$, does not operate with a specified bias voltage, and does not actively generate current, thereby achieving the effects of lower energy consumption and reduced area. However, the mixer is not limited to a passive mixer in other embodiments of this invention.

Figure 3:
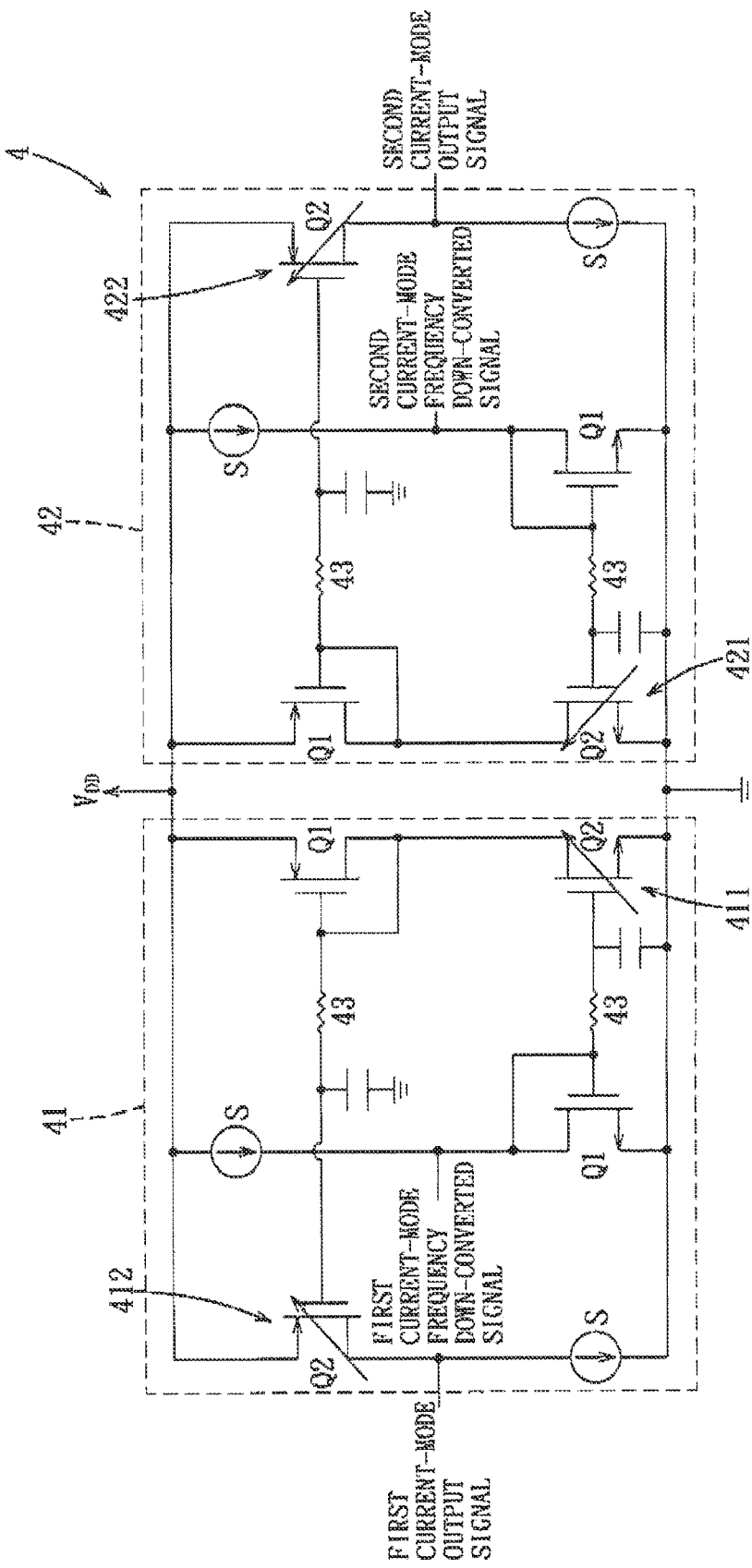
FIG. 3 is a circuit diagram, illustrating an amplifier of the first preferred embodiment.

Referring to FIG. 3, the amplifier 4 is for amplifying the first current-mode frequency down-converted signal to generate a first current-mode output signal as the current-mode output signal, and for amplifying the second current-mode frequency down-converted signal to generate a second current-mode output signal as the current-mode output signal. The amplifier 4 includes symmetrical first and second amplifying circuits 41, 42 each having a first current mirror 411, 421, and a second current mirror 412, 422 in series connection.

Each of the first and second current mirrors 411, 412, 421, 422 has a first transistor (Q1), a second transistor (Q2), and a reference current source (S). Each of the first and second transistors (Q1, Q2) has a first terminal, a second terminal, and a control terminal. The first terminals of the first and second transistors (Q1, Q2) of a same one of the first and second current mirrors 411, 412, 421, 422 are electrically connected to each other. The control terminals of the first and second transistors (Q1, Q2) of a same one of the first and second current mirrors 411, 412, 421, 422 are coupled to each other. The control terminal of the first transistor (Q1) of each of the first and second current mirrors 411, 412, 421, 422 is electrically connected to the second end of the first transistor (Q1) of a corresponding one of the first and second current mirrors 411, 412, 421, 422.

Since the configurations of the first and second amplifying circuits 41, 42 are substantially the same, only one of the first and second amplifying circuits 41, 42 will be described in greater detail in the following.

The first transistor (Q1) of the first current mirror 411 of the first amplifying circuit 41 is for receiving the first current-mode frequency down-converted signal and is coupled to the reference current source (S) at the second terminal of the first transistor (Q1) of the first current mirror 411. The second transistor (Q2) of the first current mirror 411 is coupled to the first transistor (Q1) of the first current mirror 411 for outputting a first current-mode intermediate signal according to the first current-mode frequency down-converted signal and the reference current source (S). The first current-mode intermediate signal is related to a first specified ratio of a width/length ratio of the second transistor (Q2) of the first current mirror 411 to a width/length ratio of the first transistor (Q1) of the first current mirror 411. In other words, the first current-mode intermediate signal has a current magnitude equal to a multiple of the sum of current magnitudes of the first current-mode frequency down-converted signal and the reference current source (S), the multiple being the first specified ratio.

The first transistor (Q1) of the second current mirror 412 of the first amplifying circuit 41 is for receiving the first current-mode intermediate signal at the second terminal of the first transistor (Q1) of the second current mirror 412 and from the second transistor (Q2) of the first current mirror 411. The second transistor (Q2) of the second current mirror 412 is coupled to the first transistor (Q1) of the second current mirror 412 for outputting a second current-mode intermediate signal at the second terminal of the second transistor (Q2) of the second current mirror 412 according to a second specified ratio. The second specified ratio is related to a width/length ratio of the second transistor (Q2) of the second current mirror 412 to a width/length ratio of the first transistor (Q1) of the second current mirror 412, i.e., $$\left(\frac{W}{L}\right)_2 / \left(\frac{W}{L}\right)_1.$$

The second current-mode intermediate signal has a current magnitude equal to the sum of current magnitudes of the first current-mode output signal and the reference current source (S).

It is also noted herein that the sum of the current magnitudes of the first current-mode output signal and the reference current source (S) (i.e., the second current-mode intermediate signal) is a multiple of the current magnitude of the first current-mode intermediate signal, the multiple being the second specified ratio. Preferably, each of the first and second specified ratios is configured by altering the width/length ratio of the second transistor (Q2) of one of the first and second current mirrors 411, 412, 421, 422 relative to the width/length ratio of the first transistor (Q1) of the corresponding one of the first and second current mirrors 411, 412, 421, 422. Accordingly, a ratio of the first current-mode output signal amplified by the first amplifying circuit 41 to the first current-mode frequency down-converted signal is configurable, and a ratio of the second current-mode output signal amplified by the second amplifying circuit 42 to the second current-mode frequency down-converted signal is configurable.

Therefore, the amplifier 4 has a current gain that is configured according to the width/length ratio of the first and second transistors (Q1, Q2) of the first and second current mirrors 411, 412, 421, 422, i.e., the amplifier 4 is a gain-configurable current amplifier.

It should be noted that, in other embodiments, only one current mirror or a plurality of current mirrors may be provided in each of the first and second amplifying circuits 41, 42 of the amplifier 4 to achieve a desired current gain.

Additionally, the amplifier 4 further includes four low pass filters 43 each coupled across the control terminal of the first transistor (Q1) of a corresponding one of the first and second current mirrors 411, 412, 421, 422 and the control terminal of the second transistor (Q2) of the corresponding one of the first and second current mirrors 411, 412, 421, 422.

Figure 4:
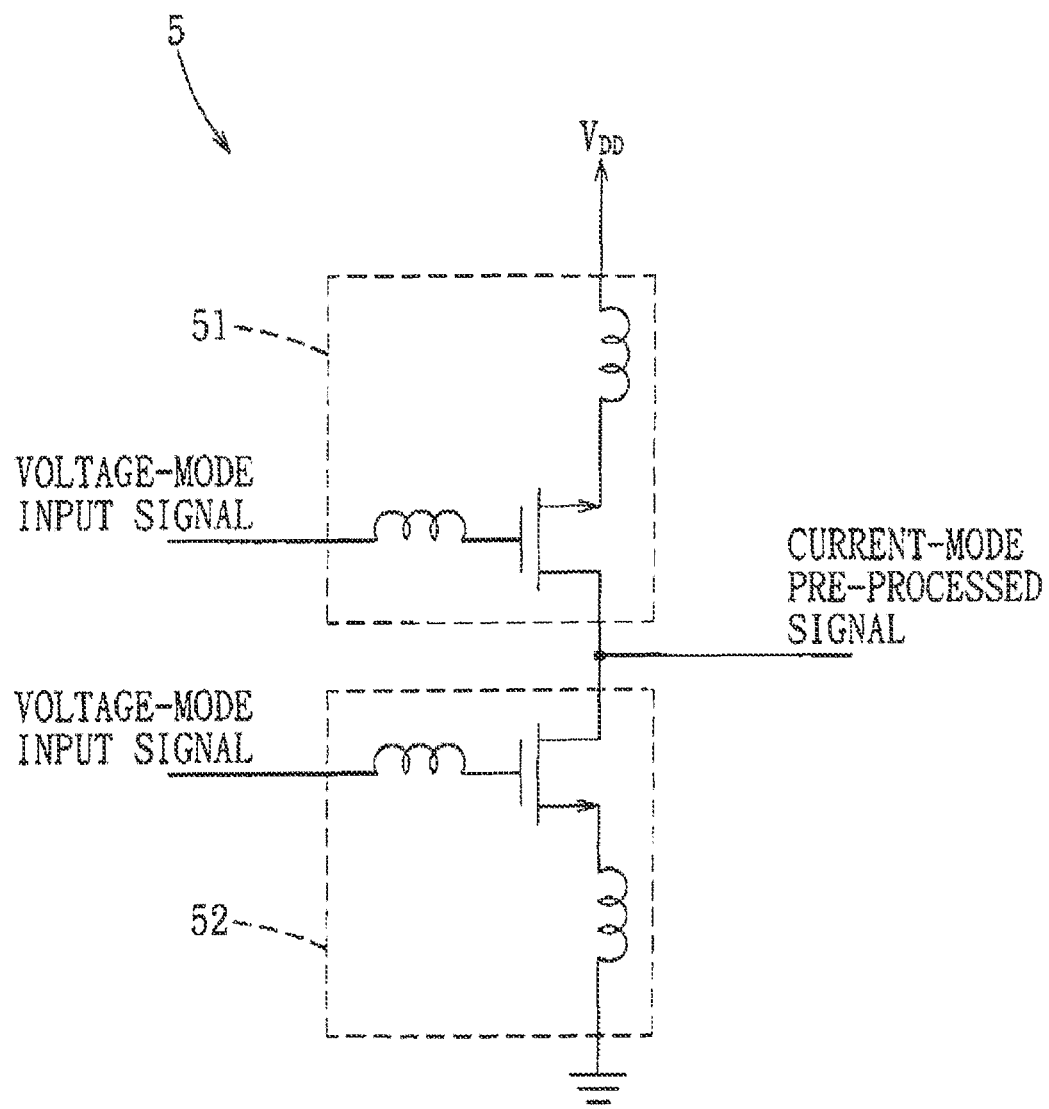
FIG. 4 is a circuit diagram, illustrating a pre-processor of a second preferred embodiment of a wireless receiver according to the present invention.

Referring to FIG. 4, a second preferred embodiment of the current-mode wireless receiver according to the present invention has a structure similar to that of the first embodiment. The main difference between this embodiment and the first embodiment resides in the configuration of the pre-processor. In this embodiment, the current-mode wireless receiver comprises a differential pre-processor 5 including a first transconductor 51, and a second transconductor 52. The first transconductor 51 and the second transconductor 52 are for receiving the voltage-mode input signal from the antenna 1 and are for converting the voltage-mode input signal into the current-mode pre-processed signal. When the first transconductor 51 is used as an impedance matching circuit for minimizing reflection of the voltage-mode input signal, the second transconductor 52 is for receiving a signal from the first transconductor 51 to output the current-mode pre-processed signal. On the other hand, when the second transconductor 52 is used as an impedance matching circuit, the first transconductor 51 is for receiving a signal from the second transconductor 52 to output the current-mode pre-processed signal. The second preferred embodiment has the same advantages as those of the first preferred embodiment.

To sum up, the advantages of the present invention are as follows. The pre-processed signal from the pre-processor 2, 5, the frequency down-converted signal from the mixer 3, and the output signal from the amplifier 4 are all current-mode signals. Therefore, a relatively low supply voltage is required, thus reducing the power consumption and increasing the linearity of the current-mode output signal.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method of wireless reception comprising:
    A) configuring a pre-processor to receive a voltage-mode input signal and output a current-mode pre-processed signal corresponding to the voltage-mode input signal, wherein configuring the pre-processor comprises configuring an impedance matching circuit in the pre-processor to receive the voltage-mode input signal and reduce reflection of the voltage-mode input signal;
    B) configuring a mixer to perform frequency down-conversion upon the current-mode pre-processed signal to generate a current-mode frequency down-converted signal; and
    C) configuring an amplifier to amplify the current-mode frequency down-converted signal to generate a current-mode output signal.

2. The method of wireless reception as claimed in claim 1, wherein step A) further includes:
    configuring a transconductor circuit of the pre-processor to receive a signal from the impedance matching circuit and convert the signal into the current-mode pre-processed signal.

3. The method of wireless reception as claimed in claim 1, wherein step B) includes:
    configuring a first transistor of the mixer to receive the current-mode pre-processed signal and a first oscillating signal; and
    configuring a second transistor of the mixer to receive the current-mode pre-processed signal and a second oscillating signal that is complementary to the first oscillating signal;
    the first transistor outputting the current-mode frequency down-converted signal according to the current-mode pre-processed signal when the first transistor is controlled by the first oscillating signal to conduct and the second transistor is cut-off by the second oscillating signal;
    the second transistor outputting the current-mode frequency down-converted signal according to the current-mode pre-processed signal when the second transistor is controlled by the second oscillating signal to conduct and the first transistor is cut-off by the first oscillating signal.

4. The method of wireless reception as claimed in claim 1, wherein step C) includes:
    configuring a first transistor of a first current mirror of the amplifier to receive the current-mode frequency down-converted signal; and
    configuring a second transistor of the first current mirror, which is coupled to the first transistor, to output a signal according to the current-mode frequency down-converted signal and a reference current source, the signal being related to a first specified ratio of a width/length ratio of the second transistor to a width/length ratio of the first transistor.

5. The method of wireless reception as claimed in claim 4, wherein step C) further includes: configuring a second current mirror of the amplifier to receive the signal from the second transistor of the first current mirror and amplify the signal received thereby according to a second specified ratio.

6. The method of wireless reception as claimed in claim 4, wherein step C) further includes coupling a low pass filter across a control terminal of the first transistor of the first current mirror and a control terminal of the second transistor of the first current mirror.

7. A wireless receiver comprising:
    a pre-processor for receiving a voltage-mode input signal and outputting a current-mode pre-processed signal corresponding to the voltage-mode input signal, wherein the pre-processor comprises an impedance matching circuit for receiving the voltage-mode input signal and reducing reflection of the voltage-mode input signal;
    a mixer for performing frequency down-conversion upon the current-mode pre-processed signal to generate a current-mode frequency down-converted signal; and
    an amplifier for amplifying the current-mode frequency down-converted signal to generate a current-mode output signal.

8. The wireless receiver as claimed in claim 7, wherein the pre-processor further includes:
    a transconductor circuit for receiving a signal from the impedance matching circuit and converting the signal into the current-mode pre-processed signal.

9. The wireless receiver as claimed in claim 7, wherein the mixer includes:
    a first transistor for receiving the current-mode pre-processed signal and a first oscillating signal; and
    a second transistor for receiving the current-mode pre-processed signal and a second oscillating signal that is complementary to the first oscillating signal;
    the first transistor outputting the current-mode frequency down-converted signal according to the current-mode pre-processed signal when the first transistor is controlled by the first oscillating signal to conduct and the second transistor is cut-off by the second oscillating signal;
    the second transistor outputting the current-mode frequency down-converted signal according to the current-mode pre-processed signal when the second transistor is controlled by the second oscillating signal to conduct and the first transistor is cut-off by the first oscillating signal.

10. The wireless receiver as claimed in claim 7, wherein the amplifier includes a first current mirror having:
   a first transistor for receiving the current-mode frequency down-converted signal; and
   a second transistor, coupled to the first transistor, for outputting a signal according to the current-mode frequency down-converted signal and a reference current source, the signal being related to a first specified ratio of a width/length ratio of the second transistor to a width/length ratio of the first transistor.

11. The wireless receiver as claimed in claim 10, wherein the amplifier further includes a second current mirror for receiving the signal from the second transistor of the first current mirror and amplifying the signal received thereby according to a second specified ratio.

12. The wireless receiver as claimed in claim 10, wherein the amplifier further includes a low pass filter coupled across a control terminal of the first transistor of the first current mirror and a control terminal of the second transistor of the first current mirror.

13. A wireless receiver comprising:
   a pre-processor for receiving an input signal and outputting a pre-processed signal corresponding to the input signal;
   a mixer for performing frequency down-conversion upon the pre-processed signal to generate a frequency down-converted signal; and
   an amplifier for amplifying the frequency down-converted signal to generate an output signal, wherein the amplifier has a current gain that is configured according to a ratio of a width/length ratio of a transistor of the amplifier;
   wherein the pre-processed signal from the pre-processor, the frequency down-converted signal from the mixer, and the output signal from the amplifier are all current-mode signals.

14. The wireless receiver as claimed in claim 13, wherein the pre-processor is a low noise amplifier.

15. The wireless receiver as claimed in claim 13, wherein the mixer is a passive mixer.

16. The wireless receiver as claimed in claim 13, wherein the amplifier is a gain-configurable current amplifier.

17. The wireless receiver as claimed in claim 13, wherein the amplifier includes a current mirror having:
   a first transistor for receiving the frequency down-converted signal; and
   a second transistor, coupled to the first transistor, for outputting a signal according to the frequency down-converted signal and a reference current source, the signal being related to a specified ratio of a width/length ratio of the second transistor to a width/length ratio of the first transistor.

* * * * *